United States Patent [19]

Sawada

[11] Patent Number: 4,651,088
[45] Date of Patent: Mar. 17, 1987

[54] DEVICE FOR TESTING SEMICONDUCTOR DEVICES

[75] Inventor: Keiichi Sawada, Itami, Japan

[73] Assignee: Mitsubishi Denki Kabushiki Kaisha, Tokyo, Japan

[21] Appl. No.: 730,750

[22] Filed: May 6, 1985

[30] Foreign Application Priority Data

May 9, 1984 [JP] Japan ................................. 59-94863

[51] Int. Cl.[4] ...................... G01R 15/12; G01R 31/22; G01R 31/28
[52] U.S. Cl. ............................ 324/73 R; 324/158 R; 371/25
[58] Field of Search ........... 324/73 PC, 73 AT, 73 R; 371/25, 20; 364/580

[56] References Cited

U.S. PATENT DOCUMENTS

| | | | |
|---|---|---|---|
| 3,976,940 | 8/1976 | Chau et al. ....................... | 371/20 X |
| 4,055,801 | 10/1977 | Pike et al. ...................... | 324/73 R X |
| 4,092,589 | 5/1978 | Chau et al. ...................... | 371/25 X |
| 4,312,067 | 1/1982 | Shirasaka ......................... | 371/25 X |
| 4,500,836 | 2/1985 | Staudacher ................ | 324/73 AT X |
| 4,519,076 | 5/1985 | Priel et al. ....................... | 371/20 X |

FOREIGN PATENT DOCUMENTS 57-18593  4/1982  Japan .

OTHER PUBLICATIONS

"Programmable Current Load" from Sentry 50 Product Description catalog of Fairchild, Apr. 1983.

Primary Examiner—Ernest F. Karlsen
Assistant Examiner—Vinh P. Nguyen
Attorney, Agent, or Firm—Birch, Stewart, Kolasch and Birch

[57] ABSTRACT

A semiconductor device testing device for conducting a logical verification and an electric characteristics measurement of a semiconductor device, includes a measuring circuit provided corresponding to each pin of the semiconductor device to be tested, the measuring circuit including a comparator intended to compare the output voltage or current from the semiconductor device with a referent voltage or current; a memory for storing information required for the logical verification and the electric characteristics measurement; a controller for controlling the execution of the logical verification and the electric characteristics measurement including an application of a reference voltage or current to the comparator; and a judging circuit to determine whether the result of the logical verification or the electric characteristics measurement is normal or abnormal from the output of the comparator.

10 Claims, 15 Drawing Figures (a)

```
PAT
  address  1  2  3  4  pin
     0
     ⋮
     7     1  0  0  0          I/O MASK timing
     ⋮                         ( 1 ., 5 ) . TM
                               control sentence
I/O
  address  1  2  3  4
     0
     ⋮
     1     1  1  0  0
     ⋮
MASK
  address  1  2  3  4
     0
     ⋮
     5     0  0  1  1
     ⋮
```

(b)

```
PAT       pin
  address  1  2  3  4  5  6  7  ----
     0     1  0  0  0  1  1  0  ---           I/O MASK HIZ timing
     1     0  1  1  0  0  0  1  ---           ( 0. 1. 0 ).TM
     ⋮                                        ( 1. 0. 1 ).TM
                                              control sentence I/O
     0     0  0  0  1  1  0  0  ---
     1     1  1  0  1  0  0  0  ---
     ⋮

MASK
     0     1  1  1  0  0  0  0  ----
     1     1  1  1  0  0  0  0  ---
     ⋮

HIZ
     0     0  0  0  0  0  0  1  ---
     1     1  0  0  0  0  0  0  ---
     ⋮
```

FIG. 7

```
PAT        Pin
 address   1  2  3  4  5  6  7  8 ---            I/O,MASK,HIZ,DC timing
       0   1  0  0  0  1  1  0  0 ---           ](0,1,0,0),TM
       1   0  1  1  0  0  0  1                  ]
       ⋮          ⋮                              control sentence I/O
       0   0  0  0  1  1  0  0  0 ---
       1   1  1  0  1  0  0  0  0 ---
       ⋮          ⋮

MASK
       0   1  1  1  0  0  0  0  0 ---
       1   1  1  1  0  0  1  1  1 ---
       ⋮          ⋮

HIZ
       0   0  0  0  0  0  0  0  0 ---
       1   1  0  0  0  0  0  0  0 ---
       ⋮          ⋮

DC                                               DRV,COM1,COM2
       0   0  0  1  0  0  0  0  1 --- %0,1,7,0,1,1
       1   0  1  0  0  0  0  0  0 --- %
       ⋮
```

| address | pin 1 | 2 | 3 | 4 | 5 | 6 | 7 | 8 | |
|---|---|---|---|---|---|---|---|---|---|
| 0 PAT | 0 | 0 | 1 | 0 | 0 | 0 | 1 | 0 | ---- |
| I/O | 0 | 0 | 1 | 1 | 0 | 0 | 0 | 0 | ---- |
| MASK | 1 | 0 | 0 | 0 | 0 | 0 | 1 | 1 | ---- |
| HIZ | 1 | 0 | 0 | 0 | 0 | 0 | 1 | 0 | ---- |
| 1 PAT | 0 | 0 | 1 | 1 | 0 | 0 | 1 | 0 | ---- |
| I/O | 0 | 0 | 1 | 1 | 0 | 0 | 0 | 0 | ---- |
| MASK | 1 | 1 | 0 | 0 | 0 | 0 | 0 | 0 | ---- |
| HIZ | 0 | 0 | 0 | 0 | 0 | 0 | 0 | 0 | ---- |

52

(b)

| address | pin 1 | 2 | 3 | 4 | 5 | 6 | 7 | 8 | |
|---|---|---|---|---|---|---|---|---|---|
| 0 PAT | 0 | 0 | 1 | 0 | 0 | 0 | 1 | 0 | ---- |
| I/O | 0 | 0 | 1 | 1 | 0 | 0 | 0 | 0 | ---- |
| MASK | 1 | 0 | 0 | 0 | 0 | 0 | 0 | 0 | ---- |
| HIZ | 1 | 0 | 0 | 0 | 0 | 0 | 1 | 1 | ---- |
| DC | 0 | 1 | 0 | 0 | 0 | 0 | 0 | 0 | ---- |
| | ( −5V, | | 7V, | | 0.3V | | −2V | | ---- ) |
| 1 PAT | 0 | 0 | 1 | 0 | 0 | 0 | 1 | 0 | ---- |
| I/O | 0 | 0 | 1 | 1 | 0 | 0 | 0 | 0 | ---- |
| MASK | 1 | 0 | 0 | 0 | 0 | 0 | 0 | 0 | ---- |
| HIZ | 1 | 0 | 0 | 0 | 0 | 0 | 1 | 1 | ---- |
| DC | 0 | 0 | 0 | 0 | 0 | 1 | 0 | 0 | ---- |
| | ( −15V, | | 7V. | | 0.3V | | −2V | | -- ) |

53

DEVICE FOR TESTING SEMICONDUCTOR DEVICES

FIELD OF THE INVENTION

The present invention relates to a device for evaluating and testing a semiconductor device.

BACKGROUND OF THE INVENTION

In order to explain the background of the invention, reference will be particularly made to FIG. 1.

In a conventional device for testing a semiconductor device shown in FIG. 1, there are provided measuring circuits 1 for conducting a function measurement, wherein the number of the circuits 1 is equal to the number of the input/output pins of a semiconductor device 2. There are further provided several precision measurement units 3 (hereinafter referred to as "PMU") for measuring DC characteristics (electric characteristics).

In the measuring circuit 1, the numeral 4 designates a driver circuit for supplying a variable DC voltage to a pat (pin) of the semiconductor device 2. The numeral 5 designates a comparator for comparing the output voltage from a pat of the semiconductor device 2 and a reference voltage. The numeral 6 designates a diode bridge circuit for supplying a variable current to a pin of the semiconductor device 2. The numerals 7 and 8 designate constant current sources connected to the diode bridge circuit 6, provided above and below thereof, respectively. The numeral 9 designates a voltage value register for storing the output voltage of the driver circuit 4. The numerals 10 and 12 designate current value registers for storing the output current of the diode bridge circuit 6. The numeral 54 designates a constant voltage source intended to supply a reference voltage to the diode bridge circuit 6. The numeral 11 designates a register intended to store the reference voltage of the diode bridge circuit 6. The numeral 13 designates a reference voltage value register for supplying a reference voltage to the comparator 5. The numeral 14 designates a contact element for connecting the input and/or output terminals of the circuits 4 to 6 to a pat of the semiconductor device 2.

FIG. 2(a) shows a test pattern 15 in accordance with which the semiconductor device testing device conducts a measuring operation. FIG. 2(b) shows the test pattern 15 in detail. In FIG. 2(b) the pattern "PAT" means a logical verification of a semiconductor device 2, and address numbers for the "PAT" are successively written in. The numeral at the right of each "PAT" address shows the logical level to be applied to the pin or the logical level to be obtained from the pin. Beyond the pattern, a control sentence showing the characteristics of the PAT pattern, such as, a loop instruction instructing to repeat the operation in the pattern, or a jump instruction is described. The numerals in parenthesis are those for designating the address of "I/O" pattern, "MASK" pattern, and "HIZ" pattern, respectively, and the "TM" is a description for calling out the timing of outputting the "0", "1" of the "PAT", that is, an information for making a waveform.

The pattern "I/O" is an input/output pin information of the semiconductor device 2 which is used to designate pins at which the bit is standing as the input pins, and to designate the other pins as the output pins. The pattern "MASK" is information representing pins to be measured, and only pins at which the bit is standing are those to be measured. The pattern "HIZ" is an information representing pins being in a high impedance state.

The operation of the device will be described in the following.

In the logical verification of the semiconductor device 2, it is necessary to check whether voltages having the waveforms shown in FIG. 4(b) are obtained or not at the output pins 3 and 4 when voltages having the waveforms shown in FIG. 4(a) are input to the input pins 1 or 2. In order to make the measuring circuit 1 operate in such a manner it is necessary to describe the test pattern 15 having a construction shown in FIG. 2(a) and (b).

In the conventional device, the test pattern 15 involved in a material such as a card is decoded by a decoder such as a card reader, and the content thereof is stored in the memory. When the device is operated, the information at zero address of the "PAT" is read out from the memory by a controller (not shown), and input/output pins of the semiconductor device 2 and pins to be measured are designated, and each of the registers 9 to 13 in the measuring circuit 1 connected to each pin is set to a predetermined value (refer to step 16 of FIG. 3(b)). A voltage of a predetermined logic level is input to each input pin from each driver circuit 4, and it is judged by the comparator 5 whether a voltage of a predetermined logic level is obtained at each pin to be measured among the output pins, whereby it is judged whether the logical verification is normal or abnormal by the controller. At the same time, a current is input to the pin from the diode bridge circuit 6 so as to measure a high impedance state, and it is detected by the comparator 5 whether the voltage of the contact element 14 rises up to a predetermined value, whereby it is judged whether the high impedance state is normal or abnormal by the controller. Such an operation is repeated until reaching the final address, and the function measurement of the semiconductor device 2 is completed (refer to step 17 of FIG. 3(b)).

On the other hand, in a DC measurement, a current is input to the pin which is to be subjected to a DC measurement by the PMU 3, and the voltage obtained is measured (refer to step 18 of FIG. 3(a)). Thereafter, a voltage is input to the pin, and the current obtained is measured (refer to step 19 of FIG. 3(a)). Such an operation is repeated several times, and it is judged whether the electric characteristics are normal or abnormal.

Under the semiconductor device testing device of such construction, the function measuring circuit 1 is provided for each pin of the semiconductor device 2, thereby making it possible to conduct a rapid test at the same time for all pins by executing the test pattern 15.

In a DC measurement, however, there are only provided 1 to 4 PMU(s) 3, and the DC measurement must be conducted by using only these small number of PMUs. These small number of PMUs make it only possible to measure each pin successively, resulting in a disadvantage that the period of time for measurement increases with the increase of the pin number. Providing the PMUs 3 correspondingly to all the pins so as to solve this problem results in another problem that the device becomes expensive because of costly PMUs 3.

As another prior art showing a testing method of a tri-state output semiconductor memory device, there is Japanese Patent Publication No. Sho. 57-18593. In this prior art, a voltage of high or low logic level is applied to an output terminal of a tri-state output semiconductor memory device through an impedance, and in this state the voltage level of the output terminal is compared with the voltage of high or low logic level. The normality or abnormality of the semiconductor memory device is judged based on the output of the comparator.

Another prior art semiconductor testing device is disclosed in an article "Programmable Current Load" in a catalogue "Sentry 50 Product Description" of FAIRCHILD, 1983. In order to judge the output state of a device a load resistance Rx of any value is usually externally connected between the device to be tested and the comparator in the testing circuit. However, this article provides a circuit construction where a load resistance of any value can be set by providing a dynamic load circuit and programmably deciding the voltage and current values applied to the dynamic load circuit.

OBJECTS AND SUMMARY OF THE INVENTION

The present invention is directed to solve the problems pointed out above with respect to the conventional device, and has for its object to provide a semiconductor device testing device capable of conducting a high speed testing of a semiconductor device.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a device for testing a semiconductor device, conducting a logical verification and an electric characteristics measurement of a semiconductor device, which comprises:

a measuring circuit provided corresponding to each pin of the semiconductor device to be tested, the measuring circuit including a comparator intended to compare the output voltage or current from the semiconductor device with a referent voltage or current;

a memory for storing information required for the logical verification and the electric characteristics measurement;

a means for controlling the execution of the logical verification and the electric characteristics measurement including an application of a reference voltage or current to the comparator; and a means for judging whether the result of the logical verificaiton or the electric characteristics measurement is normal or abnormal from the output of the comparator.

BRIEF DESCRIPTION OF THE DRAWINGS

FIGS. 2(a) and (b) are diagrams showing the test pattern 15 in the prior art device;

FIG. 7 is a diagram showing the test pattern 2 used in the device of FIGS. 5 and 6;

FIGS. 10(a) and (b) are diagrams showing the test patterns 52, 53 used in the description of the prior art device and that of the second embodiment, respectively.

DETAILED DESCRIPTION OF THE PREFERRED EMBODIMENTS

Figure 1:
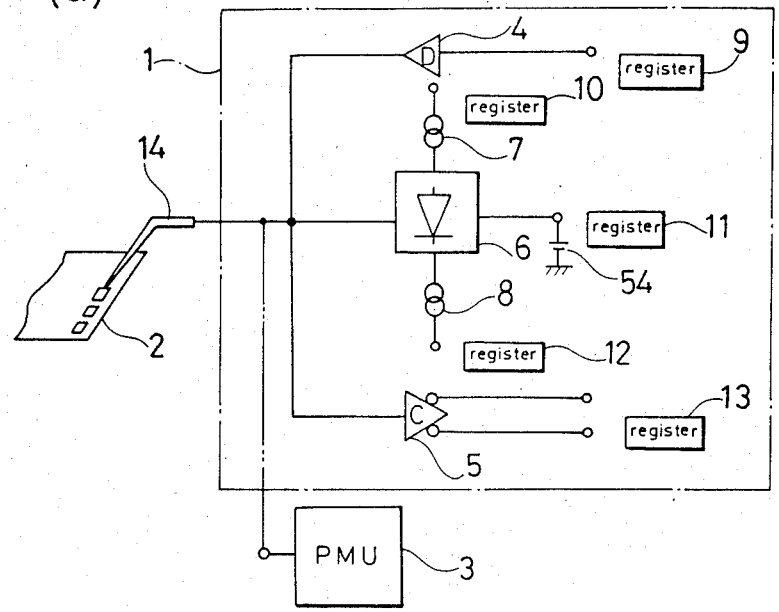
FIG. 1(a) is a schematic diagram showing a prior art semiconductor device testing device.
FIG. 1(b) is a shematic diagram showing a semiconductor device subjected to the testing.
Figure 1:
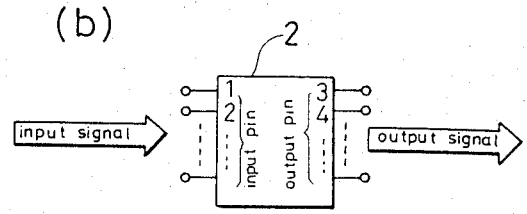
Figure 3:
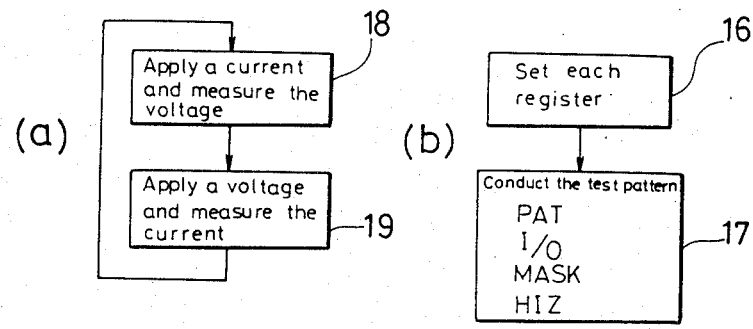
FIGS. 3(a) and (b) are diagrams showing the flow charts of DC measurement and function measurement executed by the prior art device.
Figure 4:
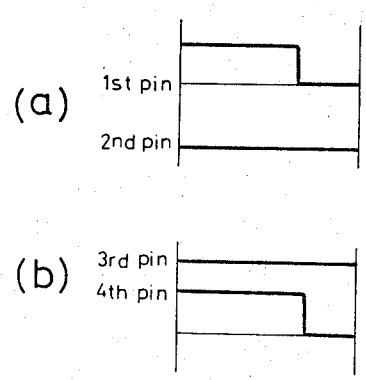
FIGS. 4(a) and (b) are diagrams showing one example of the input voltages and the output voltages in the function measurement executed by the prior art device.

In the conventional device for testing a semiconductor device shown in FIG. 1, it is possible to measure the electric characteristics such as leakage by detecting whether the voltage or the current is above a predetermined value. There is provided a comparator 5 for executing such a comparison in the measuring circuit 1. However, there are pins having no relations with the function measurement among the input/output pins designated in the above-mentioned manner. It can be considered that by utilizing the measuring circuit 1 connected to the pin it is possible to conduct the DC measurement at the same time as the function measurement.

Figure 5:
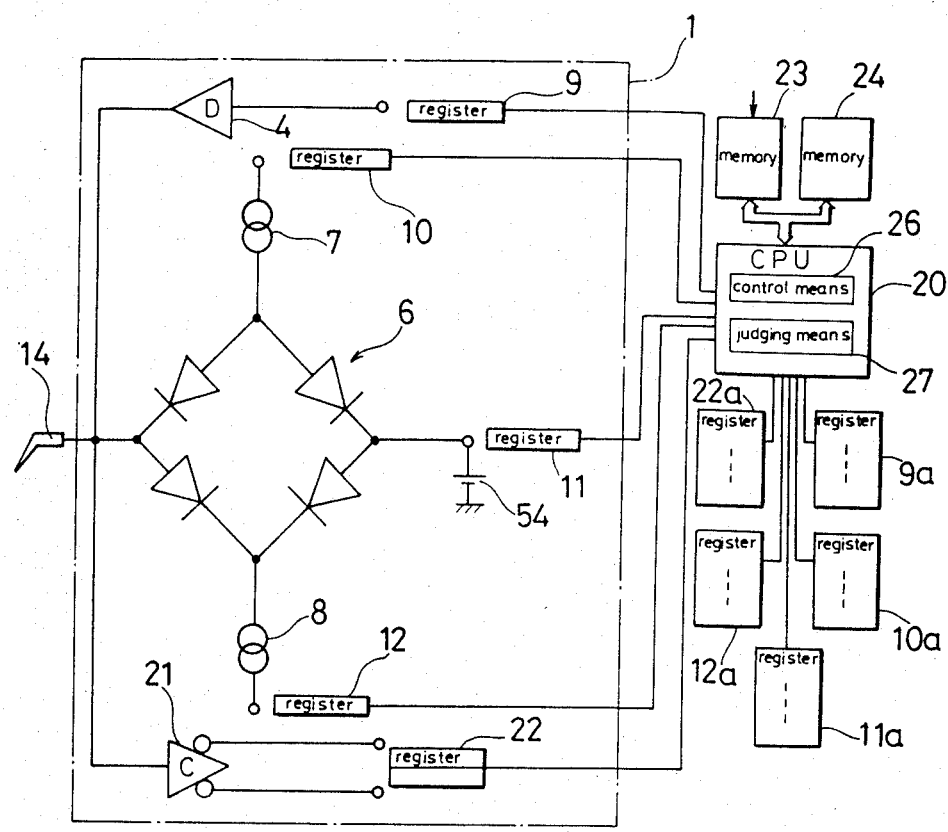
FIG. 5 and FIG. 6 are schematic diagrams showing one embodiment of the present invention.
Figure 6:
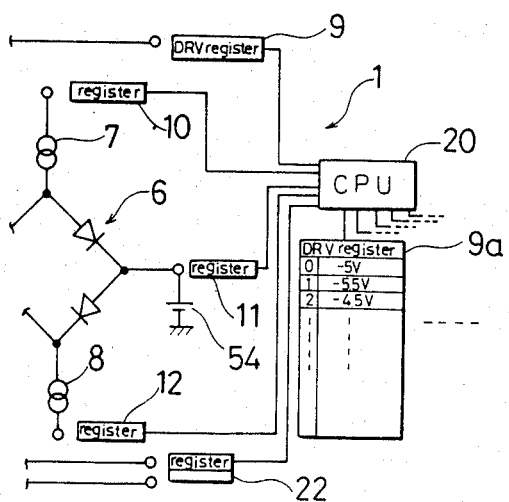

In order to explain the preferred embodiments of the present invention, reference will be particularly made to FIGS. 5 and 6.

There are provided measuring circuits 1 corresponding to all the pins of the semiconductor device 2. All the measuring circuits 1 are controlled by a CPU 20. In the measuring circuit 1, the reference numeral 4 designates a driver circuit (variable DC voltage generator) intended to generate a variable DC voltage to be applied to the pin of the semiconductor device 2. The numeral 6 designates a diode bridge circuit (variable current generator) intended to generate a variable current to be applied to the pin of the semiconductor device 2. The numeral 54 designates a voltage supply for the diode bridge circuit 6. The numeral 21 designates a comparator intended to compare the output voltage from the semiconductor device 2 and a reference voltage. The numeral 9 designates a voltage value register intended to store the output voltage value of the driver circuit 4. The reference numerals 10 and 12 designate current value registers intended to store the output current value of the diode bridge circuit 6. The numeral 54 designates a constant voltage source intended to supply a reference voltage to the diode bridge circuit 6. The numeral 11 designates a register intended to store the reference voltage of the diode bridge circuit 6. The numeral 22 designates a reference value register intended to give a reference voltage value to the comparator 21. The registers 9 to 12 have a memory region, respectively, and the reference value register 22 has two memory regions for storing the upper and the lower limits of a predetermined voltage range, thereby to detect whether the output voltage is within the voltage range in the DC measurement. However, this can be a register having only a memory region. The numeral 14 designates a contact element intended to connect the input and output terminals of the circuits 4, 6, and 21 to the pin of the semiconductor device 2.

The numerals 9a to 12a, and 22a designate control registers (second memory) intended to store the values of the registers 9 to 12 and the reference value register 22, and the registers 9a to 12a, 22a have several tens memory regions, respectively. The numeral 23 designates a memory (first memory) intended to store the information in the test pattern (refer to FIG. 7) decoded by a decoder. The numeral 24 designates a memory intended to store the abnormal results of the logical verification, the high impedance measurement, and the DC measurement.

The CPU 20 functions as the control means 26 and the judging means 27. That is, in each measuring operation the CPU 20 reads out the content of the memory 23 to designate the input pin, PAT measurement pin, HIZ measurement pin, and DC measurement pin, and sets the contents of the registers 9 to 12, 22 in the measuring circuit 1 connected to each pin to the values in the control registers 9a to 12a, 22a. Furthermore, the CPU 20 judges whether the results of the PAT measurement, HIZ measurement, and DC measurement are normal or not from the outputs of each comparator 21, and the 20 kinds of the measurements of the pins to be measured.

The operation of the device will be described below:

In the structure of the test pattern 28 of this device shown in FIG. 7, other than the conventional pin information such as I/O, MASK, HIZ, the address number 0 of the DC pattern is described in a parenthesis beyond each PAT pattern, and a DC pattern is newly added below the HIZ pattern. In this DC pattern, an address number 0 or 1 is successively written in, and the DC measurement pin information is described at the right side of each pattern address. Furthermore, the address numbers of the control registers 9a to 12a, 22a for selecting the setting values for the registers 9 to 12, 22 are described.

When the function measurement is executed using the test pattern of such construction 28, the informations of the DC measurement pins and the DC address other than the pin information are read out from the control registers, and the DC measurement conditions are given to the registers 9 to 12, and 22 in the measuring circuit 1 connected to each DC measurement pin, whereby the DC measurement is conducted. Thereafter, the same operation is repeated again when it comes to the next PAT pattern, and the DC measurements about other pins are conducted. That is, contrary to that in the conventional device, only one of the values of the registers 9 to 13 is decided to execute the test pattern before the execution of function, in the device of the present invention, the values of the registers 9 to 12, 22 are changed in real time with the execution of the test pattern. Thus, the DC measurement other than the logical verification can be conducted at the same time as the execution of the test pattern by conducting a judgement by the comparator 21 with applying a current and a voltage to some pin, thereby reducing the period of testing time to a great extent.

Figure 8:
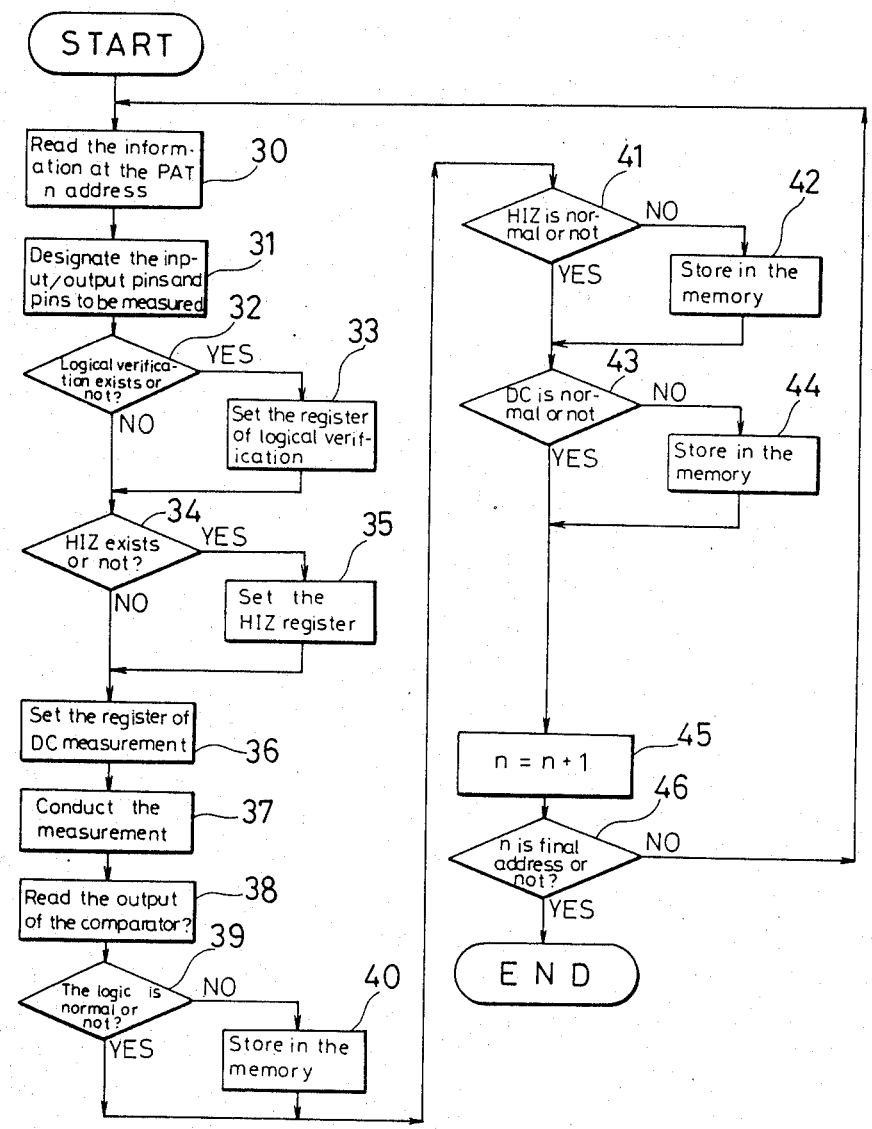
FIG. 8 is a diagram showing the flow chart of the operation of the device.
Figure 9:
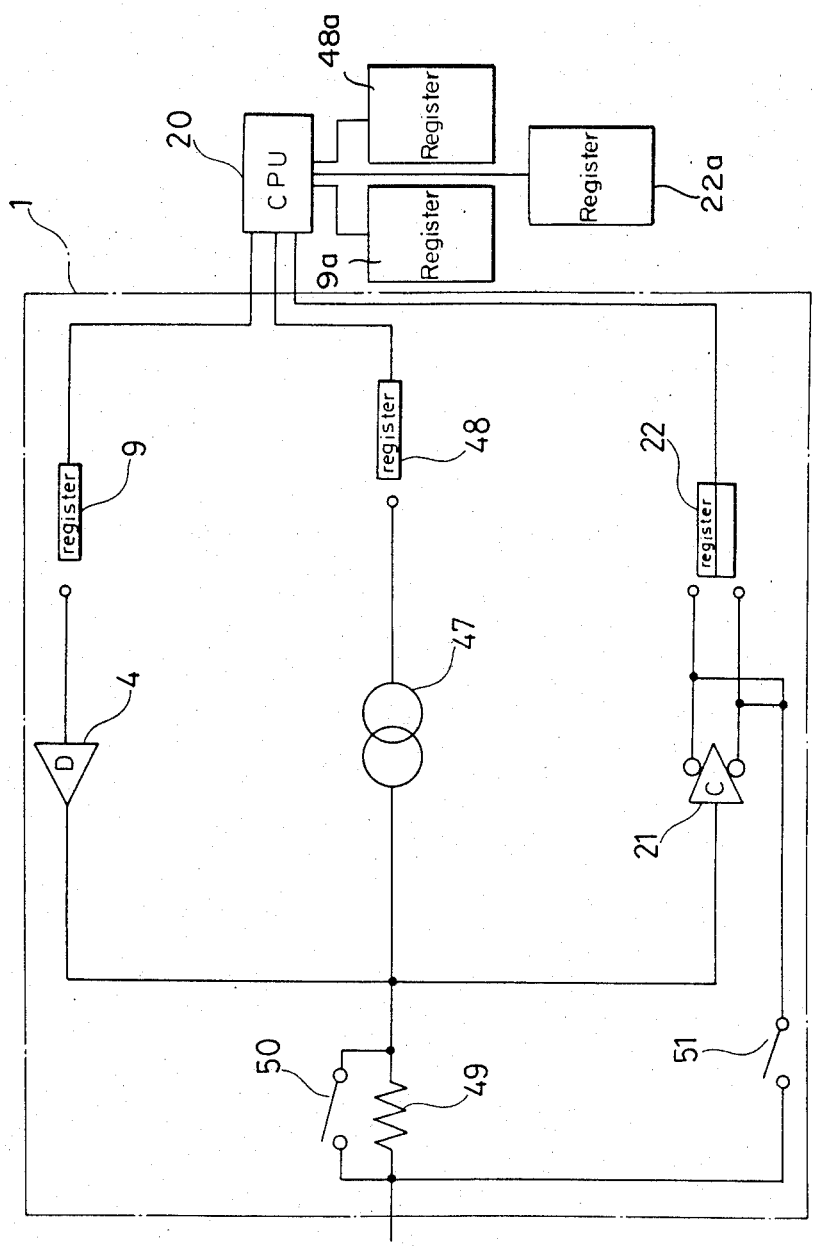
FIG. 9 is a schematic diagram showing a second embodiment of the present invention.

The operation of the circuits in the DC measurement and the function measurement are described with reference to the test pattern 28 shown in FIG. 7 and the flow chart in FIG. 8.

In this device, at first the test pattern 28 is decoded, and the content thereof is stored in the memory 23. When the device is operated, the information of the PAT address 0 is read out (refer to step 30). In this case, the pins 4, 5 (I/O "1") are designated as input pins, and the pins 1, 2, 3, 6, 7, 8 (I/O "0") are designated as output pins because the I/O address is 0. The pins 1, 2, 3, 6, 7, 8 (MASK "1") are designated as measurement pins because the MASK address is "1". There is no pin designated as HIZ measurement pin because the HIZ address is "0". The pins 3 and 8 (DC "1") are designated as DC measurement pins and the addresses of the control registers 9a to 12a, 22a for DC measurement are read out because the DC address is "0" (refer to step 31).

Thereafter, the registers 9 to 12, 22 in the measuring circuit 1 connected to the designated input pins and PAT measurement pins are set to a predetermined value, and the registers 9 to 12, 22 of DC measurement pins are set to the values read out from the control registers 9a to 12a, 22a, for example, the driver register 9 is set to −5 volt which is a value of the address "0" (refer to steps 32 to 36).

When the measurement is executed, voltages of "0" level and "1" level are input to the input pin 4 and 5, respectively, and it is detected whether voltages of "1", "0", "1", and "0" level are output from the output pin 1, 2, 6, and 7, respectively, or not by the comparator 21 for each pin. At the same time, a predetermined current from the diode bridge circuit 6 is input to the pins 3 and 8, and it is detected by the comparator 21 whether the voltage of the contact element 14 rises up to within a predetermined range or not, for example, whether the pin 3 and 8 are at "0" and "0" level, respectively (refer to step 37). It is judged by the CPU 20 whether the PAT measurement result is normal or not, and whether the DC measurement result is normal or not from the output of the comparator 21 and the kinds of the measurements of the measurement pins. In the case of normality, this PAT pattern is passed by, and in the case of abnormality the measurement result is stored in the memory 24 (refer to steps 38 to 44), and the measurement of the next PAT address "1" is conducted (refer to steps 45, 46).

As evident from the foregoing, the function measurement and the DC measurement are conducted at the same time, whereby the period of time for DC measurement is reduced to a great extent with relative to the conventional device where the PMUs are used. Furthermore, the conventional circuit for the function measurement is used as it is to conduct a DC measurement, thereby not resulting in an increased cost. There is no necessity to provide PMUs at all the pins, thereby rather resulting in a reduced cost.

In the above illustrated embodiment the HIZ measurement is included in the function measurement, but this HIZ measurement can be abbreviated. Furthermore, the variable current generator can be constituted not by the diode bridge circuit 6 and its peripheral circuits 10 to 12, but by the constant current source 47 and the control register 48 for controlling the current source 47.

Furthermore, in the above illustrated embodiment the DC measurement is conducted by measuring the voltage when a current is applied, but the current can be measured when a voltage is applied. In such a case, a standard resistance 49 and relays 50 and 51 are combined, and the voltage between the both ends of the resistance 49 is measured by the comparator 21 to be converted into a current, whereby a judgement by current is realized. Furthermore, the construction of the test pattern can be not of an address reference system, but of a description system as shown in FIG. 10. FIG. 10(a) shows a test pattern 52 for the conventional function measurement, and FIG. 10(b) shows a test pattern 53 for the function measurement and DC measurement of the present invention.

The invention being thus described, it will be obvious that the same may be varied in many ways. Such variations are not to be regarded as a departure from the spirit and scope of the invention and all such modifications are intended to be included within the scope of the following claims.

What is claimed is:

1. A device for testing semiconductor devices, conducting a logical verification and an electric characteristics measurement of a semiconductor device that has a plurality of pins, the pins being terminals for the semiconductor device, comprising:

a plurality of measuring means, one of said plurality of measuring means corresponding to each respective one of the plurality of pins of the semiconductor device to be tested, for measuring electrical characteristics and for carrying out logical verifications, each one of said plurality of measuring means including a comparator that compares an output signal from the semiconductor device with a reference signal, each one of said plurality of measuring means also including a plurality of registers that store test signals;

memory means, connected to each one of said plurality of measuring means, for storing information required for the logical verification and the electric characteristics measurement;

means, connected to each of said measuring means and to each of said memory means, for controlling the application of test signals to the semiconductor device to start the test of the logical verification and the electric characteristics of the semiconductor device, including the application of said reference signal to said comparator in each of said plurality of measuring means; and means connected to said measuring means for analyzing an output of said comparator to determine whether the results of the logical verification and the measurement of the electric characteristics are normal.

2. A device for testing semiconductor devices, conducting a logical verification and an electric characteristics measurement of a semiconductor device that has a plurality of pins, the pins being terminals for the semiconductor device, comprising:

a plurality of measuring means, one of said plurality of measuring means corresponding to each pin of the semiconductor device to be tested, for measuring electrical characteristics and for carrying out logical verification, said measuring means including;

a variable DC voltage generator, a voltage value register for storing the output voltage of the variable DC voltage generator, a variable current generator, a current value register for storing the output current of the variable current generator, a comparator that compares an output signal from a pin of the semiconductor device with a reference signal to produce a comparison signal, a reference value register that supplies a reference value for said reference signal to the comparator;

an input/output terminal;

a contact element connected to said input/output terminal of the measuring circuit;

first memory means for storing information about pins of the semiconductor device that are to be designated as input pins and pins of the semiconductor device that are to be designated as output pins for a logical verification, logical levels that are to be applied to each of the designated input pins, logical levels to be obtained from each of the designated output pins, and selected ones of the pins amoung the plurality of pins to be subjected to the measurement of electric characteristics;

second memory means for storing the values of said voltage value register, said current value register, and said reference value register, said reference value being applied to each of the input pins, to the logical verification pins, and to the electric characteristics measurement pins in accordance with the information stored in said first memory means;

control means connected to said first memory means, and second memory means and each of said measuring means for reading out the content of said first memory means with respect to a measuring operation and to set said voltage value register, said current value register, and said reference value register to the values stored in the second memory; and means, responsive to said comparison signal, for determining whether a result of the logical verification and the electric characteristics of the semiconductor device in each measuring operation is normal.

3. The device of claim 1 wherein said output signal is a voltage signal and said reference signal is a voltage signal.

4. The device of claim 1 wherein said output signal is a current signal and said reference signal is a current signal.

5. The device of claim 1 wherein said memory means includes a plurality of central registers, with each of said registers in said plurality of measuring means corresponding to one of said plurality of central registers.

6. The device of claim 2 wherein said output signal is a voltage signal and said reference signal is a voltage signal.

7. The device of claim 2 wherein said output signal is a current signal and said reference signal is a current signal.

8. The device of claim 2 wherein said variable current generator includes a diode bridge circuit.

9. The device of claim 2 wherein said variable current generator includes a constant current source and a control register that controls said constant current source.

10. The device of claim 6 wherein said comparator measures an output voltage between two ends of a standard resistance that is attached to said input/output terminal and converts the output voltage into a current.

* * * * *